United States Patent [19]

Chan

[11] Patent Number: 4,885,231

[45] Date of Patent: Dec. 5, 1989

[54] PHASE-SHIFTED GRATINGS BY SELECTIVE IMAGE REVERSAL OF PHOTORESIST

[75] Inventor: Winston K. Chan, Fair Haven, N.J.

[73] Assignee: Bell Communications Research, Inc., Livingston, N.J.

[21] Appl. No.: 191,186

[22] Filed: May 6, 1988

[51] Int. Cl.$^4$ ............................................. G03C 5/16
[52] U.S. Cl. .................................... 430/321; 430/323; 430/326; 430/329; 430/394; 430/328
[58] Field of Search ............... 430/320, 321, 326, 323, 430/328, 394, 329; 372/96, 102

[56] References Cited

U.S. PATENT DOCUMENTS 4,104,070  8/1978  Moritz et al. ........................ 430/329
4,806,454  2/1989  Yoshida et al. ..................... 430/321

OTHER PUBLICATIONS

Koyama et al., "1.5 μm Phase Adjusted Active Distributed Reflector Laser . . .", Electronic Letters, vol. 20, pp. 391–392, May 1984.
Utaka et al., "λ/4–Shifted InGaAsP/InP DFB Lasers . . . ", Electronic Letters, vol. 20, Nov. 1984, pp. 1008–1009.
H. A. Haus et al., "Antisymmetric Taper of Distributed Feedback Lasers", *IEEE J. Quantum Electron.*, QE–12, pp. 532–539, Sep. 1976.
K. Utaka et al., "Analysis of Quarter-Wave-Shifted DFB Lasers", *Electronic Letters*, vol. 20, pp. 326–327, Apr. 12, 1984.
K. Sekartedjo et al., "1.5 μm Phase-Shifted DFB Lasers for Single-Mode Operation", *Electronic Letters*, vol. 20, pp. 80–81, Jan. 19, 1984.

*Primary Examiner*—José G. Dees
*Attorney, Agent, or Firm*—James W. Falk

[57] ABSTRACT

Image reversal is controlled to occur in lithographically defined regions of a positive photoresist. In that way, selective reversal of a simple holographic grating is achieved to obtain 180-degree phase shifts within lithographically defined regions of the grating. Such a phase-shifted grating is useful, for example, to provide distributed feedback in a semiconductor laser designed for single-longitudinal-mode operation.

11 Claims, 1 Drawing Sheet

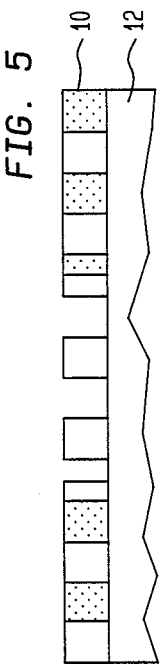
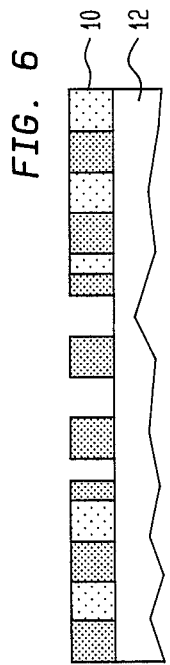
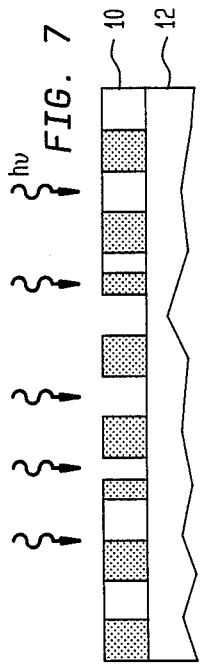
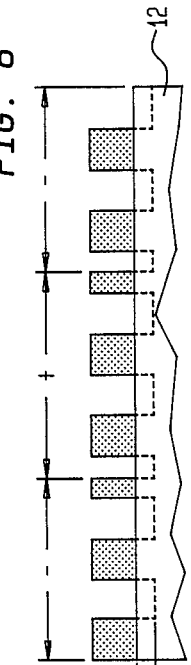
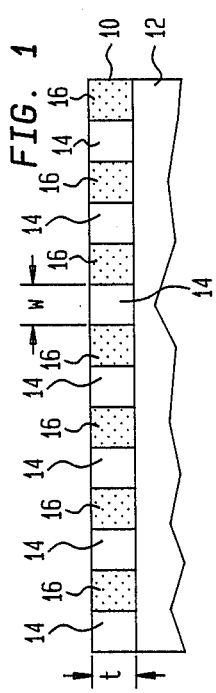
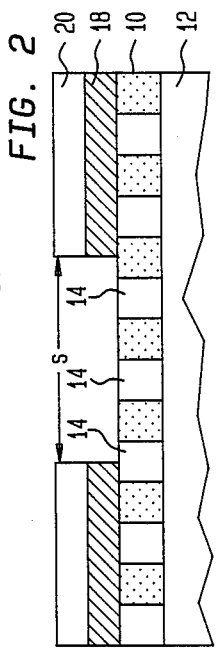
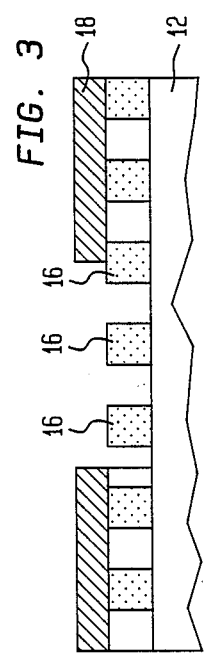
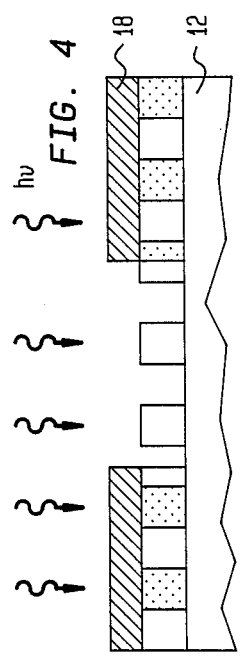

PHASE-SHIFTED GRATINGS BY SELECTIVE IMAGE REVERSAL OF PHOTORESIST

BACKGROUND OF THE INVENTION

This invention relates to optical devices and, more particularly, to the fabrication of an optical device such as a distributed-feedback (DFB) laser that includes a phase-shifted grating.

Gratings are included in a variety of discrete and integrated optical devices of practical importance. For example, semiconductor lasers incorporating a grating to provide distributed feedback have emerged as the most promising candidate for achieving single-longitudinal-mode operation. In a DFB laser, the period of a first-order grating for a 1.55-micrometer ($\mu$m) wavelength laser is only about a quarter of a micrometer. Conventional contact or projection photolithography is not feasible for realizing such fine grating structures. But fine-pitched simple gratings, without a phase shift, have been made by standard holographic techniques. In accordance with such techniques, the interference of a laser beam with itself results in exposing a layer of photoresist with a light intensity characterized by a sinusoidal distribution.

A DFB laser with a simple grating exhibits a two-fold degeneracy. As a result, stable single-mode operation is not always achieved. But this degeneracy can be eliminated by introducing a quarter-wave phase shift in the grating (which corresponds to a 180-degree phase shift in a first-order grating), as described by H. A. Haus et al, "Antisymmetric Taper of Distributed Feedback Lasers," IEEE J. Quantum Electron, QE-12, 532(1976) and K. Utaka et al, "Analysis of Quarter-Wave-Shifted DFB Lasers," Electronic Letters, 20, 326 (1984).

Various techniques are known for making phase-shifted gratings suitable, for example, for use in DFB lasers. One technique utilizes direct-writing electron-beam lithography [see K. Sekartedjo et al, "1.5 $\mu$m Phase-Shifted DFB Lasers for Single-Mode Operation", Electronic Letters, 20, 80 (1984)]. But this technique suffers from the disadvantages of long writing times, grating period nonuniformity, high equipment cost, and possible stitching and address digitizing errors.

Other proposed techniques for making phase-shifted gratings are based on a holographic grating with either the use of an appropriately patterned phase retardation plate [F. Koyama et al, "1.5 $\mu$m Phase Adjusted Active Distributed Reflector Laser for Complete Dynamic Single-Mode Operation," Electronic Letters, 20, 391 (1984)] or the simultaneous use of positive and negative photoresists, with the reversal between the positive and negative images producing the desired 180-degree phase shift [K. Utaka et al, "$\lambda$/4-Shifted InGaAsP/InP DFB Lasers by Simultaneous Holographic Exposure of Positive and Negative Photoresists," Electronic Letters, 20, 1008 (1984)]. But each of these known techniques also suffers from one or more disadvantages such as: requiring complex processing, producing an uneven grating structure, exhibiting a relatively wide phase-shift transition region or producing a phase shift that is dependent on the grating period.

Accordingly, continuing efforts have been directed by workers skilled in the art aimed at trying to devise other ways of making a phase-shifted grating. It was recognized that these efforts, if successful, had the potential for providing a basis for making optical devices such as DFB lasers characterized by lower cost and improved performance.

SUMMARY OF THE INVENTION

In accordance with the principles of my invention, a 180-degree phase shift is obtained in a holographic grating by utilizing a standard novolac-type positive photoresist. By means of a chemical treatment, image reversal is controlled to occur in lithographically defined regions of the photoresist. In these defined regions, the photoresist behaves as a negative resist. In all other regions, the photoresist acts as a positive resist. Hence, the grating pattern formed in the lithographically defined regions is exactly 180 degrees out of phase with respect to the pattern formed in the other regions.

More specifically, my inventive method for making a device structure includes forming a simple holographic grating comprising regularly occurring exposed and unexposed regions in a layer of a positive photoresist that is supported on a substrate. First and second portions of the photoresist are then lithographically defined. Subsequently, the exposed and unexposed regions of the photoresist layer are processed to cause the unexposed regions in the lithographically defined first portion to be insoluble in a developer and to cause the exposed regions in the second portion to be also insoluble in the developer. All the processed regions are then developed to form a photoresist pattern having positive and negative images in the first and second portions, respectively.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which:

FIG. 1 is a schematic side-view depiction in cross-section of a simple holographic grating, without a phase shift, exposed in a layer of positive photoresist which is supported on a substrate;

and FIG. 2 through 8 represent illustrative steps of my inventive method by which the FIG. 1 structure is converted into a 180-degree phase-shifted grating.

DETAILED DESCRIPTION

FIG. 1 shows a layer 10 of a conventional novolac-type positive photoresist deposited on a substrate 12. The layer 10 is designed to be relatively thin to achieve a short grating period and to eliminate standing wave effects during holographic exposure. By way of a specific illustrative example, the layer 10 comprises a commercially available positive photoresist such as AZ1350B diluted with a commercially available thinner, which is spun onto the surface of the substrate 12 in a standard way to a thickness t of about 70 nanometers (nm).

Illustratively, the phase-shifted grating described herein comprises an element of a conventional multilayered DFB laser structure. In such an illustrative structure, the substrate 12 of FIG. 1 comprises, for example, a layer of indium phosphide.

In known ways, the photoresist layer 10 of FIG. 1 is exposed to a simple holographic grating. This is done, for example, utilizing an HeCd laser (442 nm) as the light source. Illustratively, the beam provided by the source is split and recombined using a conventional corner cube arrangement. In such an arrangement, half of the beam is directly incident on the layer 10 while the other half is reflected off a mirror and then onto the layer 10 to intersect the first half at an angle determined by the orientation of the corner cube with respect to the incident beam. In turn, this angle determines the period of the resulting simple grating exposed in the photoresist layer 10.

The simple grating defined in the photoresist layer 10 of FIG. 1 by the aforementioned conventional holographic technique includes a regular periodic pattern comprising alternating exposed and non-exposed portions 14 and 16, respectively. In one specific illustrative case, the width w of each of the portions 14 and 16 is only about 0.125 $\mu$m. In a direction perpendicular to the plane of the drawing, these portions can extend over the entire surface of a wafer on which, for example, multiple DFB lasers including phase-shifted gratings are being batch fabricated.

Next, a layer 18 of a material that will later serve as a mask for defining phase-shifted regions in the photoresist layer 10 is deposited over the entire extent of the layer 10, without further exposing or otherwise affecting the photoresist layer. This material must be patternable in a way that will not affect the underlying photoresist layer 10 and must also be opaque to light. By way of example, germanium is an advantageous such material. Thus, illustratively, a 55-nm-thick layer of germanium is thermally evaporated overlying the layer 10.

Another layer 20 of positive photoresist is then spun onto the germanium layer. Advantageously, the formulation and thickness of this layer are substantially identical to those of the layer 10. This additional layer of photoresist is then selectively exposed and developed in conventional ways to provide openings overlying regions of the layer 10 that are later to be positively developed.

Subsequently, the patterned positive photoresist overlying the uniform layer 18 of germanium is flood exposed. Then, utilizing the exposed photoresist as an etch mask, the germanium layer is patterned. This is done, for example, in a standard wet etching step using a 1:10 $H_2O_2:H_2O$ solution. At that point in the process, the structure being fabricated appears as shown in FIG. 2.

The width s of the lithographically defined opening or window formed in the layers 18 and 20 of FIG. 2 defines the lateral extent in the layer 10 wherein the underlying portions 14 and 16 will be subsequently developed in a positive manner (i.e., initially exposed photoresist portions 14 therein will be removed). By contrast, the remainder or masked extent of the layer 10 shown in FIG. 2 will be subsequently developed in a negative manner (i.e., initially non-exposed photoresist portions 16 therein will be removed).

Next, in a conventional positive developing step, all positive photoresist in FIG. 2 that has been exposed and is not masked or protected by the layer 18 is removed. Thus, the patterned layer 20 and unprotected ones (or parts of) the portions 14 are removed. The resulting structure is depicted in FIG. 3.

The image represented by the unexposed portions 16 in the window of FIG. 3 is then fixed. This is done by flood exposure of the structure, as represented in FIG. 4. This provides a basis for ensuring that the image in the window will not be removed during later processing.

The germanium mask 18 of FIG. 4 is then removed by using, for example, the wet etchant specified above. At that point, the structure appears as shown in FIG. 5.

The entire FIG. 5 structure is then treated to deactivate the exposed portions of the negative image and the undeveloped portions of the positive image (which were flood exposed in FIG. 4). In FIG. 5, these exposed portions of the layer 10 are represented by clear rectangles. Illustratively, deactivation is carried out by exposing the entire FIG. 5 structure to about half an atmosphere of anhydrous ammonia for at least one hour at approximately 100 degrees Celsius. This causes a chemical reaction that renders all the previously exposed photoresist insoluble in developer.

More specifically, the photoactive compound in a novolac-type positive photoresist is 1,2-naphthaquinone diazide which converts to indene carboxylic acid upon exposure to ultraviolet light. This acid is soluble in an alkaline solution (developer) whereas the original diazide is not. This property provides the chemical basis of most commercial positive photoresists. However, when the indene carboxylic acid is exposed to a base such as ammonia at an elevated temperature, the acid decomposes to indene which, like the original diazide, is insoluble in an alkaline solution. But unlike the original diazide, the decomposed material is no longer photoactive and can be considered deactivated by the ammonia. The original diazide is not substantially affected by the ammonia and retains its photoactivity, although at a somewhat reduced sensitivity.

Thus, it is apparent that the photoresist considered herein can be in one of three states: unexposed (diazide), exposed (indene carboxylic acid) or deactivated (indene). The photoresist can go to the exposed state only by light exposure and to the deactivated state only by light exposure followed by the base (ammonia) treatment, and only the exposed (but not deactivated) photoresist can be developed.

The densely stipled rectangles in FIG. 6 represent exposed portions of the positive photoresist layer 10 that have been deactivated. At that point, the only photoresist left on the substrate 12 that has not been deactivated comprises unexposed portions of the negative image. In FIG. 6, these unexposed portions are represented by lightly stipled rectangles.

As indicated in FIG. 7, the unexposed portions of the photoresist layer 10 are then exposed in a flood exposure step. Subsequently, these clear-rectangle or exposed portions are removed in a standard developing step. The resulting structure is shown in FIG. 8.

In FIG. 8, the grating sections designated with negative signs look as if they had been initially exposed in FIG. 1 in negative photoresist whereas the grating section designated with a positive sign corresponds to a conventionally developed image defined in positive photoresist.

In some devices of practical importance, the photoresist pattern shown in FIG. 8 may itself be utilized as a 180-degree phase-shifted grating. In other cases, additional material such as, for example, aluminum may be deposited on the top surface of the substrate 12 in between the photoresist portions shown in FIG. 8. The photoresist is then removed in a standard lift-off process, thereby leaving in place on the substrate 12 a phase-shifted grating defined by the additional deposited material.

Still further, the photoresist pattern shown in FIG. 8 may be employed as an etch mask for forming the actual grating in the substrate 12. For a substrate made of indium phosphide, etching is carried out, for example, utilizing a standard wet etchant such as a hydrobromine solution comprising HBr, $Br_2$ and $H_2O$. By way of example, trenches (indicated by dash lines in FIG. 8) having a depth d of about 100 nm are thereby formed in the substrate 12. The photoresist pattern is then removed. Additional standard layers of a device structure such as a DFB laser are subsequently formed overlying the herein-described phase-shifted grating, as is well known in the art.

Thus, in accordance with my invention, selective reversal of grating sections obtains 180-degree phase shifts within lithographically defined regions. Advantageously, this is done by using only one type of photoresist, thus avoiding the simultaneous use of positive and negative photoresists which can result in inadvertent intermixing of the two and which typically requires relatively complex processing. Also, as described herein, a phase-shifted grating made in accordance with this invention is initially entirely formed in photoresist so that the whole pattern can be transferred to the substrate at once. This is in contrast to the known two-photoresist method that requires separate transfer of positive and negative images, which leads to uneven etching of the two regions corresponding to the images. Further, in my method, the transition region between positive and negative images can in practice be much less than a micrometer whereas, in techniques using positive and negative photoresists or a phase retardation plate, light scattered from steps in the photoresist or in the phase retardation region. Furthermore, in contrast to the phase-retardation-plate technique, my method of making a phase-shifted grating always provides exactly a 180-degree phase shift independent of the grating period. Moreover, in accordance with my unique method, the phase-shifted regions of a grating structure are defined by conventional lithography, which allows the regions to be precisely aligned during device fabrication to standard fiducial marks included on a wafer.

Finally, it is to be understood that the above-described steps and structural arrangements are only illustrative of the principles of the present invention. In accordance with these principles, numerous modifications and alternatives may be devised by those skilled in the art without departing from the spirit and scope of the invention.

What is claimed is:

1. A device fabrication method comprising the steps of
    forming exposed and unexposed regions in a layer of positive photoresist supported on a substrate;
    forming a mask to cover a first portion of said layer of photoresist and to leave uncovered a second portion of said layer of photoresist;
    processing the exposed and unexposed regions of said layer of photoresist to cause the unexposed regions in said second portion to be insoluble in developer and to cause the exposed regions in said first portion to be insoluble in developer;
    and developing the processed regions in said first and second portions to form a photoresist pattern having negative and positive images in said first and second portions, respectively, of said layer of positive photoresist.

2. A method as in claim 1 wherein said first-mentioned forming step includes forming in said layer of photoresist a simple holographic grating comprising regularly occurring exposed and unexposed regions, and wherein the processed regions in said first and second portions are developed to form a 180-degree phase-shifted grating.

3. A method as in claim 2 wherein said second-mentioned forming step includes forming a mask having at least one window overlying said layer of photoresist, said first portion being covered by said mask and said second portion lying within said window.

4. A method as in claim 3 wherein said processing step comprises
    removing with a developer exposed regions of said layer of photoresist that lie within said mask window.
    exposing the regions of said layer of photoresist that remain within said mask window,
    removing said mask overlying said layer of photoresist,
    treating the photoresist remaining on said substrate to deactivate all previously exposed regions by rendering them insoluble in developer,
    flood exposing the photoresist remaining on said substrate to cause all previously unexposed regions to be exposed,
    and removing with a developer all exposed regions of said layer of photoresist that have not been deactivated.

5. A method as in claim 4 wherein said treating step comprises
    subjecting the remaining photoresist to about half an atmosphere of anhydrous ammonia at approximately 100 degree Celsius for at least about one hour.

6. A method as in claim 5 wherein said mask comprises germanium.

7. A method as in claim 6 wherein said substrate comprises indium phosphide.

8. A method as in claim 7 wherein said positive photoresist comprises a novolac-type photoresist.

9. A method as in claim 4 wherein the developed photoresist pattern is itself utilized as the 180-degree phase-shifted grating included in said device.

10. A method as in claim 4 wherein the developed photoresist pattern is utilized as a mask for forming by lift-off a 180-degree phase-shifted grating on the surface of said substrate pattern.

11. A method as in claim 4 wherein the developed photoresist pattern is utilized as a mask for etching said substrate to form therein a 180-degree phase-shifted grating.

* * * * *

UNITED STATES PATENT AND TRADEMARK OFFICE
CERTIFICATE OF CORRECTION

PATENT NO. : 4,885,231

DATED : December 5, 1989

INVENTOR(S) : Winston K. Chan

It is certified that error appears in the above-identified patent and that said Letters Patent is hereby corrected as shown below:

Column 5, Line 33, after "retardation" insert --plate typically sets a lower limit of about one micron on the width of the transition--.

Signed and Sealed this

Fifteenth Day of October, 1991

Attest:

HARRY F. MANBECK, JR.

*Attesting Officer*   Commissioner of Patents and Trademarks